United States Patent

Sugahara

[11] Patent Number: 6,084,298
[45] Date of Patent: Jul. 4, 2000

[54] MANUFACTURING OF SEMICONDUCTOR DEVICE

[75] Inventor: Kenji Sugahara, Tokyo, Japan

[73] Assignee: NEC Corporation, Tokyo, Japan

[21] Appl. No.: 08/613,690

[22] Filed: Mar. 11, 1996

[30] Foreign Application Priority Data

Mar. 10, 1995 [JP] Japan ................................ 7-050265

[51] Int. Cl.⁷ ...................... H01L 23/053; H01L 23/12
[52] U.S. Cl. ............................................. 257/701; 257/678
[58] Field of Search ................................. 257/701, 703, 257/704, 698, 678

[56] References Cited

U.S. PATENT DOCUMENTS

| | | |
|---|---|---|
| 4,340,902 | 7/1982 | Honda et al. . |
| 4,513,355 | 4/1985 | Schroeder et al. . |
| 5,438,478 | 8/1995 | Kondo et al. . |
| 5,650,593 | 7/1997 | McMillan et al. . |
| 5,689,091 | 11/1997 | Hamzehdoost et al. . |
| 5,698,896 | 12/1997 | Komatsu et al. . |
| 5,721,454 | 2/1998 | Palmer . |

*Primary Examiner*—Sheila V. Clark
*Attorney, Agent, or Firm*—Sughrue, Mion, Zinn, Macpeak & Seas, PLLC

[57] ABSTRACT

In a semiconductor device, a ceramic package having a first surface and a second surface and having a recession section provided on the first surface side is provided. The recession section has a first opening provided at a center portion of the recession section and penetrating to the second surface, and pads provided in a peripheral portion of the second opening on the first surface side of the recession section. A semiconductor element mounted on a mount substrate is inserted in the first opening from the second surface side of the ceramic package. The semiconductor element is smaller than the mount substrate and has pads in a peripheral portion of the semiconductor element. The pads on the recession section and the pads on the semiconductor element are connected by electrically conductive wires.

6 Claims, 6 Drawing Sheets

MANUFACTURING OF SEMICONDUCTOR DEVICE

BACKGROUND OF THE INVENTION

1. Field of the Invention

The present invention relates to a semiconductor device, and more particularly to packaging of a semiconductor device by use of a ceramic package.

2. Description of Related Art

A ceramic package is superior in material characteristics such as electric insulation, thermal conduction, thermal expansion, mechanical strength and chemical stability. Further, since the economical mass production process of the ceramic package has been established, the ceramic package is widely used in the semiconductor integrated circuit field.

A conventional semiconductor device using such a ceramic package will be described below with reference to FIG. 1. First, original ceramic plates which are called green sheets (three green sheets in the figure) are formed and then via-holes for wiring and an opening for mounting a semiconductor element are formed for each of the green sheets other than one to form internal package wirings. Next, the plurality of green sheets are laminated and baked to form a ceramic package 21. External leads 23 are soldered to the baked ceramic package, and planting is performed for completion of the ceramic package 21. A semiconductor element 25 is mounted to a recession section of the ceramic package as a semiconductor element mount section by metal solder 26. The mounted semiconductor element 25 and the ceramic package 21 are connected by metal wires 28 made of metal such as aluminum (Al) or gold (Au) for electric connections. The ceramic package 21 shown in FIG. 1 is formed through the above processes. Further, the ceramic package is sealed and a semiconductor device is completed.

In the above conventional process of forming the ceramic package, the green sheet shrinks 20 to 30% in the baking. Further, a common difference between a design size and an actual size of the opening such as the recession section is about 10% because of displacement between the green sheets generated when the green sheets are laminated. In addition, as shown in FIG. 2, in the process of assembling the semiconductor device, a space is required for a tool 29 to hold the semiconductor element 25 and to move to the recession section of the ceramic package 21 and a space is required to vibrate the tool 29 for fitting the semiconductor element 25 to the recession section. Therefore, the actual dimension of the recession section needs to be larger at least 2 mm than that of the semiconductor element 25.

As described above, in such a ceramic package type semiconductor device, because the metal wires between the semiconductor element 25 and the ceramic package 21 are long, there is a problem in that the number of semiconductor elements 25 are limited due to an inductive component of the metal wires and that the operation speed cannot be increased.

SUMMARY OF THE INVENTION

The present invention has, as an object, to provide a ceramic package and a manufacturing method for the same in which two green sheets are used for low cost and high speed operation of a semiconductor device.

Another object of the present invention is to provide a semiconductor device and a manufacturing method for the same in which a high speed operation is made possible by using the above ceramic package and the semiconductor device has a good heat release characteristic from a semiconductor element.

In order to achieve an aspect of the present invention, a ceramic package includes a first green sheet having pads connected to a wiring pattern formed on the first surface side, and a second green sheet having a second opening larger than the first opening at the center portion and adhered to the first green sheet on the first surface side. The laminated green sheets are baked to form the ceramic package. Thereafter the first opening is formed. The first opening may be formed in the first green sheet in advance. In this case, the opening forming process can be omitted. The first opening may have a size fit to the semiconductor element, or may have a predetermined size regardless of the semiconductor element.

In order to achieve another aspect of the present invention, a semiconductor device includes, in addition to the above ceramic package, a semiconductor element section mounted on the second surface of the ceramic package, wherein the semiconductor element section has a mount substrate and a semiconductor element smaller than the mount substrate, fixed to under the substrate and fit in the opening from the second surface side of the ceramic package, and wherein the semiconductor element has pads in a peripheral portion of the semiconductor element, and wires for connecting the pads on the recession section and the pads on the semiconductor element. The mount substrate is desirably made of electrically and/or thermally conductive material. In a case of using the electrically conductive material, the semiconductor element section is adhered to the ceramic package on the second surface side with electrically conductive material, so that the semiconductor element can be connected to the ground. In a case of using thermally conductive material, heat can be effectively radiated or released from the semiconductor element. In order to further increase the heat radiation, the mount substrate preferably has a surface area on a side opposite to the semiconductor element lager than that on a side of the semiconductor element.

In order to achieve still another aspect of the present invention, a method of manufacturing a semiconductor device, includes the steps of:

providing a ceramic package having a first surface and a second surface and having a recession section provided on the first surface side, wherein the recession section has a first opening provided at a center portion of the recession section and penetrating to the second surface, and pads provided in a peripheral portion of the second opening on the first surface side of the recession section;

inserting a semiconductor element mounted on a mount substrate in the first opening from the second surface side of the ceramic package, wherein the semiconductor element is smaller than the mount substrate and has pads in a peripheral portion of the semiconductor element; and connecting between the pads on the recession section and the pads on the semiconductor element by electrically conductive wires.

BRIEF DESCRIPTION OF DRAWINGS

FIGS. 3A to 3E are diagrams illustrating the processes of manufacturing a ceramic package type semiconductor device according to the present invention, wherein FIGS. 3A, 3B and 3E are perspective views of the cross sectional structure of the semiconductor device and FIGS. 3C and 3D are cross sectional views of the semiconductor device;

DETAILED DESCRIPTION OF THE PREFERRED EMBODIMENTS

The ceramic package type semiconductor device of the present invention will be described below with reference to the accompanying drawings.

FIGS. 3A to 3E are diagrams illustrating the processes of manufacturing the ceramic package type semiconductor device.

Figure 3A:
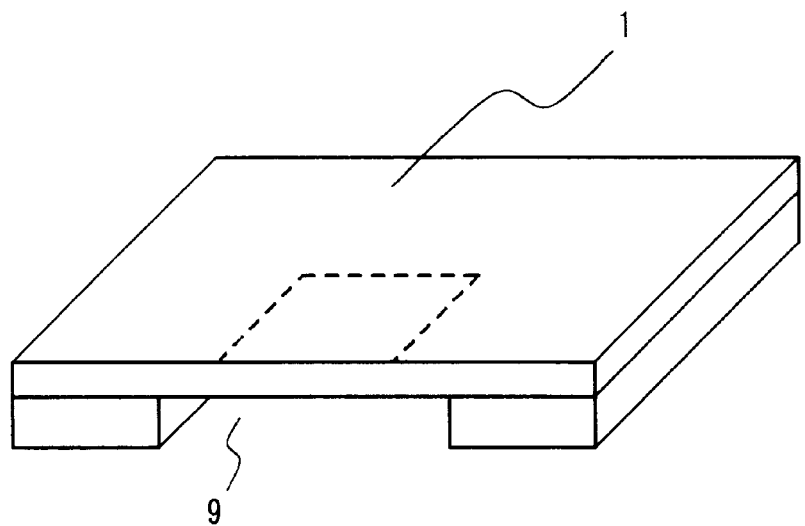

First, referring to FIG. 3A, a glass component, a pigment component and an organic solvent component are mixed with ceramic powder made of material such as $Al_2O_3$ and a green sheet for a ceramic package is formed using a Doctor Fraze method. Subsequently, via-holes for wiring are formed by a press method and then the internal wiring of the ceramic package, including pads, is formed by a screen printing method using a conductive paste. Next, an opening is formed in one green sheet for forming a recession section 9. The one green sheet having the opening is laminated on one or more green sheets. The plurality of green sheets (two green sheets in this embodiment) are applied with pressure and adhered to each other by binder without providing any mount opening of a semiconductor element in the recession section 9. The lamination of green sheets is baked in hydrogen ambient to form a ceramic package 1.

Figure 3B:
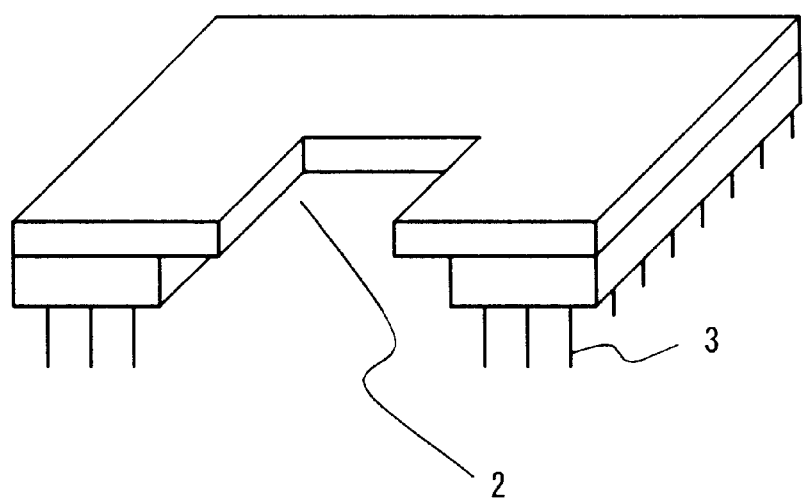

Next, as shown in FIG. 3B, the semiconductor element mount opening 2 is formed in the center portion of the recession section 9 of the ceramic package 1 by a mechanical work method such as wire discharging work. Then, external leads 3 are soldered to the ceramic package 1 and metal planting is executed to the ceramic package 1. The subsequent processes are the same as those in the above-mentioned conventional semiconductor device.

In the manufacturing process of the ceramic package according to the present invention, the semiconductor element mount opening 2 is formed in the recession section 9 after the green sheets are laminated and the lamination is baked. Accordingly, it is possible to work the ceramic package with the precision of a few micrometers. Therefore, the size precision can be remarkably increased compared to the conventional method of manufacturing the ceramic package.

In the above-mentioned processes of manufacturing the ceramic package 1, the semiconductor element mount opening 2 is formed after the lamination of green sheets is baked. However, an opening may be provided for the green sheet in advance, considering the shrink upon the baking. In this case, the work for forming the opening 2 can be omitted. Further, if the wiring pattern and leads can be made common to another semiconductor element and the target semiconductor element, the formed ceramic package can be also used even for the other semiconductor element smaller than the target semiconductor element, resulting in decrease in cost.

Figure 3C:
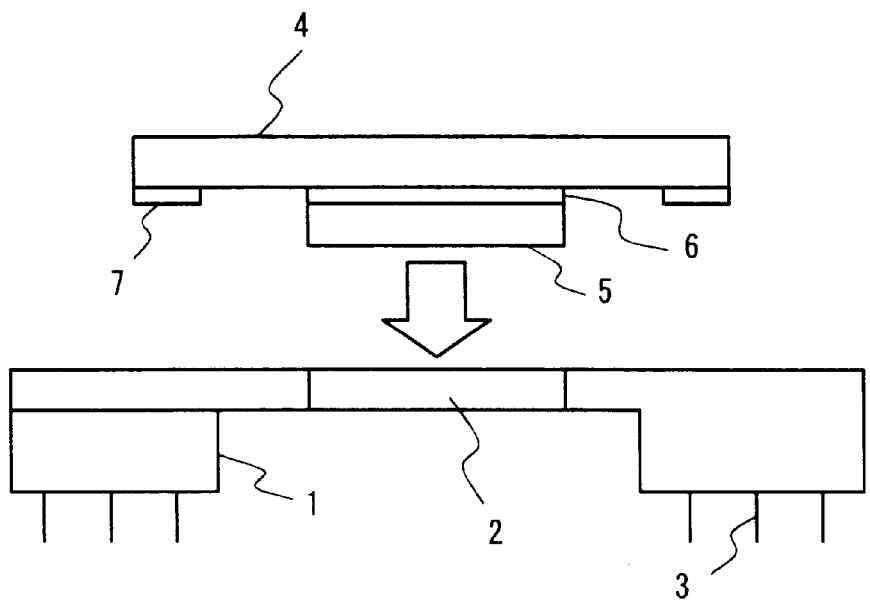
Figure 3D:
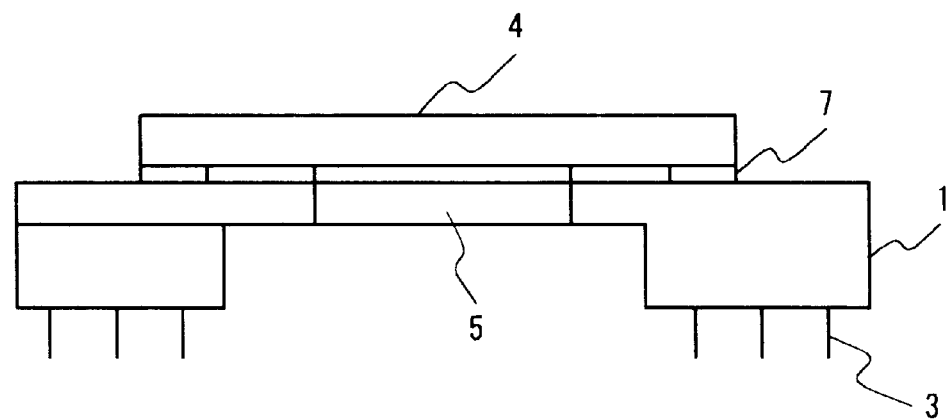
Figure 3E:
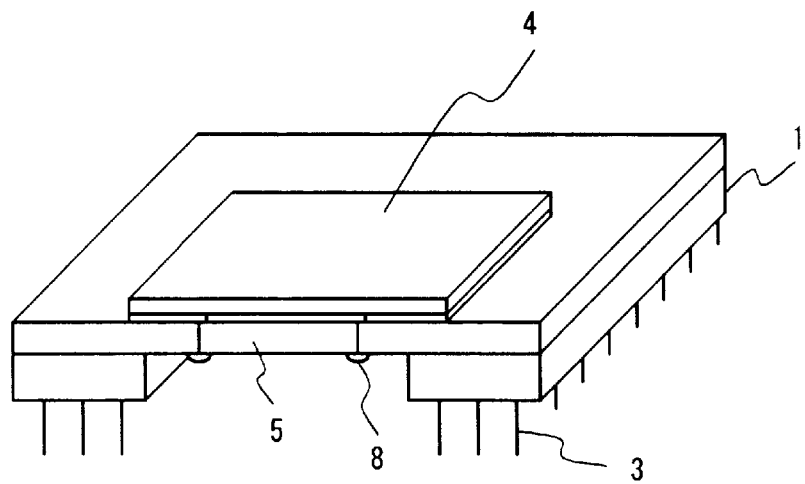

FIGS. 3C and 3E are diagrams illustrating a process of assembling a semiconductor device using the ceramic package 1 formed as described above. Referring to FIG. 3C, the target semiconductor element 5 having pads the peripheral portion is adhered and fixed under a semiconductor element mount substrate 4. The substrate 4 is made of material superior in thermal and electric conductivity such as CuW and Al by metal soldering material 6 made of material such as AuSi. Then, as shown in FIG. 3D, the semiconductor element 5 is inserted into the opening 2 which has been provided by the mechanical work in the ceramic package 1, such that the surface of semiconductor element 5 provided with the pads appears in the recession section 9 of the ceramic package 1. Subsequently, the ceramic package 1 and the substrate 4 under which the semiconductor element 5 is mounted are adhered to each other by material 7 such as AuSn alloy, solder or resin. Because the AuSn alloy has a melting point as high as 300° C., thermal influence to the semiconductor element 5 is very less. By the material 7, the semiconductor element 5 is sealed on the top surface side of the ceramic package 1. Next, as shown in FIG. 3E, each pad on the semiconductor element 5 is connected to a corresponding pad on the ceramic package 1 by a wire 8 made of material such as Au or Al to complete the semiconductor device.

Figure 4:
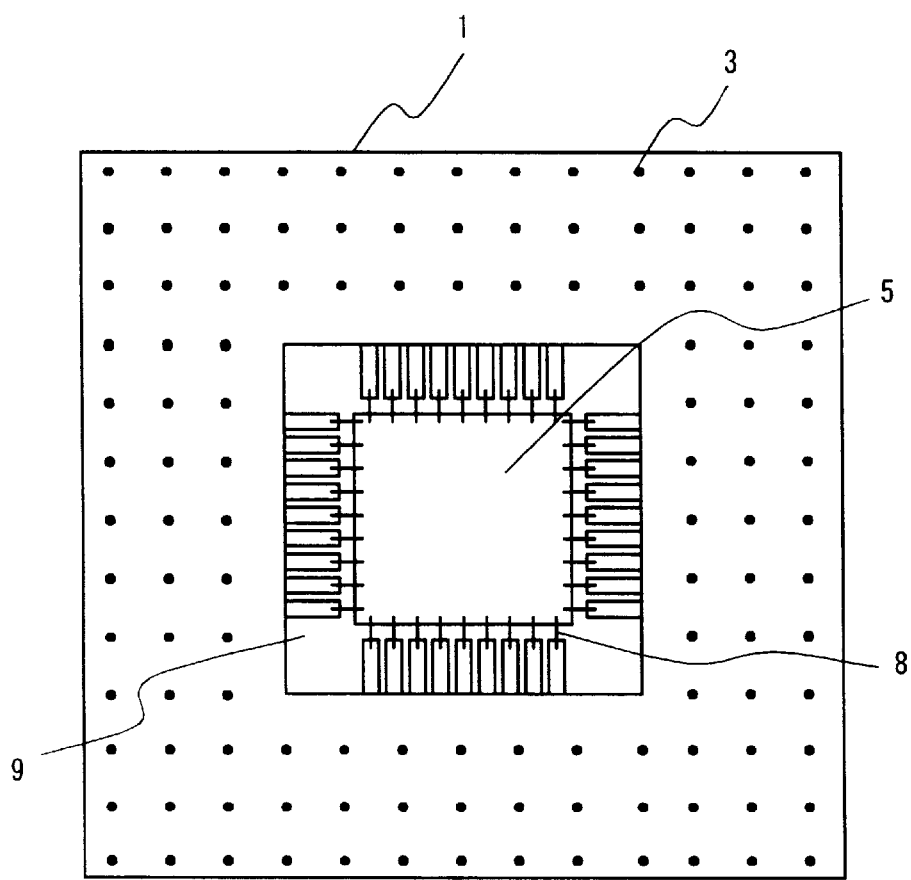
FIG. 4 is a plan view of the ceramic package type semiconductor device according to the present invention from the bottom side.

FIG. 4 is a plan view of the semiconductor device from the bottom. Seen from the figure, the semiconductor element 5 is connected to the pads on the ceramic package 1 by the wires 8 and then to electrodes provided outside of the ceramic package 1 via the leads 3.

Figure 1:
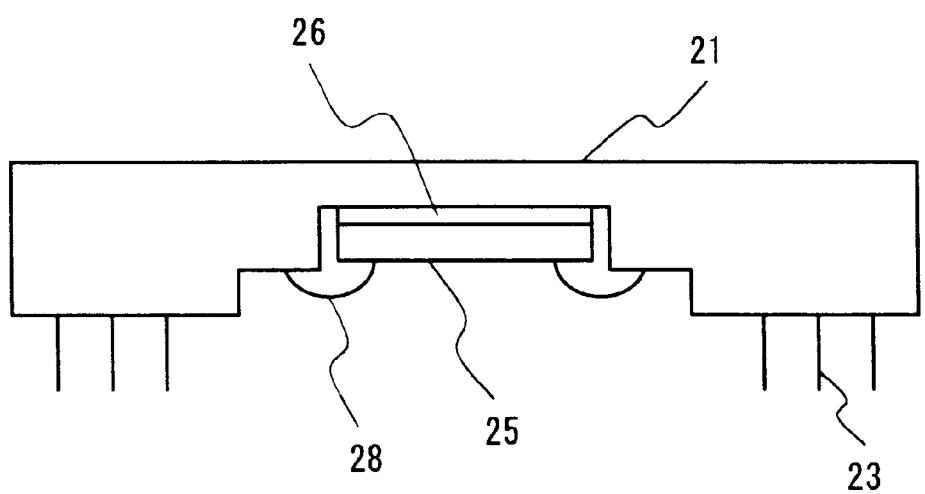
FIG. 1 is a cross sectional view of the structure of a conventional ceramic package type semiconductor device.
Figure 2:
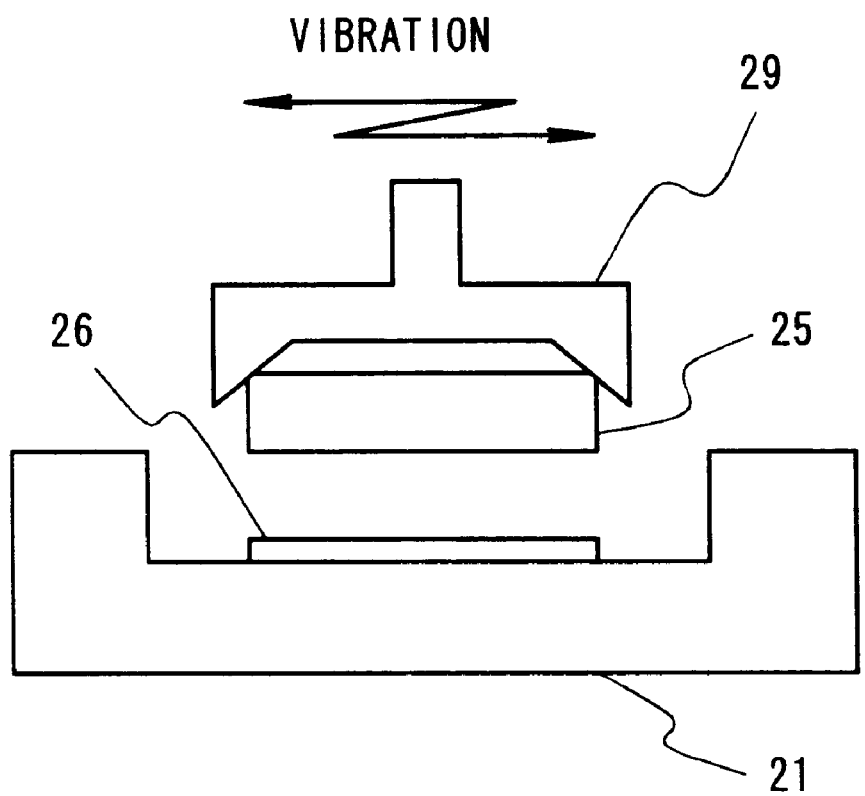
FIG. 2 is a cross sectional view of the process of adhering a semiconductor element to a ceramic package in the conventional semiconductor device shown in FIG. 1.

As described, according to the ceramic package type semiconductor device according to the present invention, it is possible to provide the opening having substantially the same size as that of the semiconductor element. Therefore, the wire 8 between the semiconductor element 5 and the ceramic package 1 can be decreased more than 1.5 mm in long and more than 1 nH in inductance, comparing to the conventional ceramic package type semiconductor device shown in FIGS. 1 and 2. As a result, the number of semiconductor devices operable at the same time can be increased and the operation speed of the semiconductor device can be increased.

Further, since the semiconductor element is inserted after the opening 2 is formed, only two green sheets are required in the above embodiment. This is less by one than the number of green sheets in the conventional semiconductor device. Thus, even if the wiring pattern becomes complicated and the number of green sheets is increased, the required number of green sheets is less by one than the conventional semiconductor device.

In addition, since the semiconductor element is inserted in the opening 2, an external terminal can be provided outside of the ceramic package via the opening.

Figure 5:
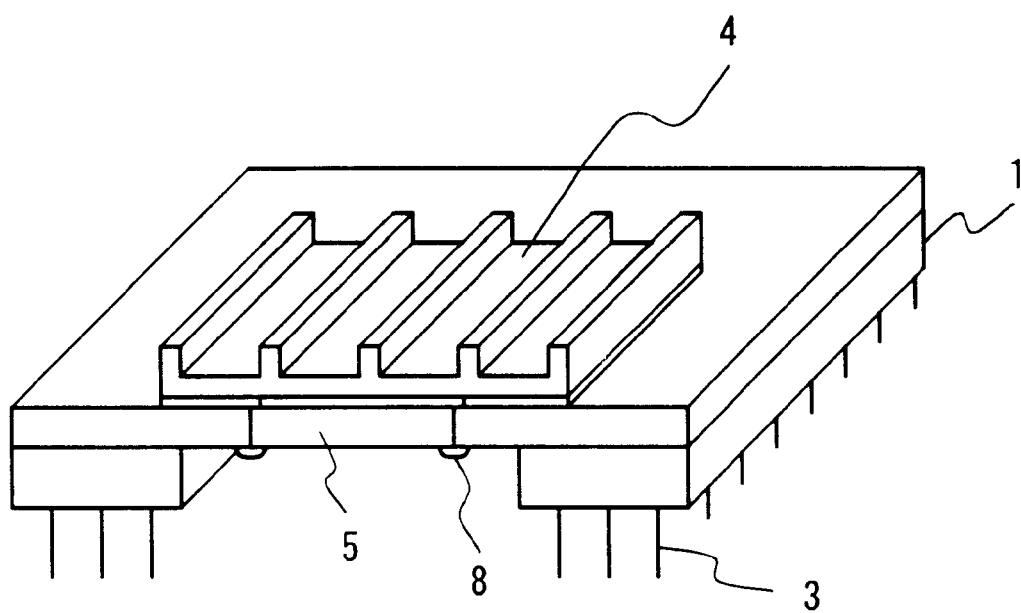
FIG. 5 is a perspective view of the cross sectional structure of the ceramic package type semiconductor device according to another embodiment of the present invention.

Next, a modification of the semiconductor device according to the present invention will be described with reference to FIG. 5. Referring to FIG. 5, the semiconductor element mount substrate 4 has fins for releasing heat. As a result, the substrate 4 on the top side has the surface area larger than that of the bottom surface on which the semiconductor element 5 is mounted. In this manner, because the top surface of the substrate 4 is exposed in the air and has the larger surface area, the heat from the semiconductor element 5 can be effectively radiated, so that temperature rising of the semiconductor element can be prevented. In this case, the material 6 is desirably made of thermally conductive.

What is claimed is:

1. A semiconductor device, comprising:

a ceramic package having a first surface defining a first surface side and a second surface defining a second surface side, said ceramic package having a recession section provided on said first surface side, wherein said recession section has a mount opening provided at a center portion of a bottom of said recession section and penetrating to said second surface, said ceramic package further comprising pads provided in a peripheral portion of said mount opening on said first surface side;

a semiconductor element section mounted on said second surface of said ceramic package, wherein said semiconductor element section has a mount substrate and a semiconductor element smaller than said mount substrate fixed to said mount substrate and fit in said mount opening from said second surface side of said ceramic package, and wherein said semiconductor element has pads in a peripheral portion of said semiconductor element; and wires for connecting the pads on said first surface side and the pads on said semiconductor element; and where said semiconductor element has substantially a same size as said mount opening in said recession section.

2. The semiconductor device according to claim 1, wherein said ceramic package having a first surface defining a first surface side and a second surface defining a second surface side, further comprises:

a first ceramic plate having said mount opening and said pads connected to a wiring pattern formed on said first surface side; and a second ceramic plate having another opening larger than said opening at the center portion of the bottom of said recession section and adhered to said first ceramic plate on said first surface side.

3. The semiconductor device according to claim 1, wherein said mount substrate is made of electrically conductive material.

4. The semiconductor device according to claim 3, wherein said semiconductor element is mounted to said mount substrate with electrically conductive material and said semiconductor element section is adhered to said ceramic package on said second surface side with electrically conductive material.

5. The semiconductor device according to claim 1, wherein said mount substrate is made of thermally conductive material.

6. The semiconductor device according to claim 5, wherein said mount substrate has a surface area on a side of said mount substrate opposite to said semiconductor element larger than a surface area on a side of said mount substrate where said semiconductor element is mounted to said substrate.

* * * * *